United States Patent [19]
Kim

[11] Patent Number: 5,818,379
[45] Date of Patent: Oct. 6, 1998

[54] FLASH ANALOG TO DIGITAL (A/D) CONVERTER WITH REDUCED NUMBER OF COMPARATORS

[75] Inventor: Young-moog Kim, Suwon, Rep. of Korea

[73] Assignee: Samsung Electronics, Co., Ltd., Suwon, Rep. of Korea

[21] Appl. No.: 818,269

[22] Filed: Mar. 17, 1997

[30] Foreign Application Priority Data

Mar. 19, 1996 [KR] Rep. of Korea ..................... 1996-7380

[51] Int. Cl.$^6$ ........................................................ H03M 1/36
[52] U.S. Cl. ............................................................ 341/159
[58] Field of Search .................................. 341/159, 161, 341/118, 120, 155, 156

[56] References Cited

U.S. PATENT DOCUMENTS 4,617,549  10/1986  Reiner ..................................... 341/159
5,635,937   6/1997  Lim et al. ............................... 341/161

*Primary Examiner*—Brian K. Young
*Attorney, Agent, or Firm*—Marger, Johnson, McCollom &Stolowitz P.C.

[57] ABSTRACT

An N-bit flash A/D converter with a reduced number of comparators is disclosed. The A/D converter includes a reference voltage generator which includes $2^N$ serially connected resistors, connected between a first supply voltage and a second supply voltage. The reference voltage generator provides a reference voltage at each junction between two resistors. The A/D converter further includes a comparing portion which includes first through mth comparators, where m is equal to $2^{(N-1)}-1$, for comparing every other reference voltage output from the reference voltage generator to an analog signal. An address generator generates a $2^{(N-1)}$ bit address responsive to the output of each of the comparators. An upper digital word generator generates N−1 upper bits of a digital word in response to the address. The lower digital word generator selects one of the remaining reference voltages responsive to the address, compares the selected reference voltage with the analog signal, and generates the least significant bit of the digital word. The latch portion latches N−1 upper bits and the least significant bit of the digital word.

20 Claims, 2 Drawing Sheets

FLASH ANALOG TO DIGITAL (A/D) CONVERTER WITH REDUCED NUMBER OF COMPARATORS

BACKGROUND OF THE INVENTION

1. Field of the Invention

The present invention relates to an analog-to-digital (A/D) converter, and more particularly, to a flash A/D converter.

2. Description of the Related Art

Digital signal processing is widely used for rapid and accurate signal processing. Generally, A/D or digital-to-analog (D/A) converters are part of circuits used for signal processing. Major components of A/D converters include a comparator, a switch, a sample and hold circuit, and a reference voltage generator for providing an accurate reference voltage.

FIG. 1 is a circuit diagram of a conventional 4-bit flash A/D converter. Referring to FIG. 1, a conventional flash A/D converter includes a reference voltage generator 1, a sample and hold circuit 3, a comparing portion 5, an address generator 7, a digital word generator 9, and a latch 10.

As the number of bits increases, the conventional flash A/D converter requires a greater number of comparators thereby increasing power consumption and semiconductor layout area. Furthermore, the conventional A/D converter operating characteristics can deteriorate depending on variations in the fabrication process. Therefore, a need remains for a flash A/D converter which optimizes power consumption, reduces layout area requirements, and minimizes performance deterioration due to fabrication process variations.

SUMMARY OF THE INVENTION

An object of the present invention is to provide a flash A/D converter which overcomes the problems associated with conventional A/D converters. Another object of the present invention is to provide a flash A/D converter which reduces power consumption and layout area by reducing the number of comparators.

To achieve the above objects, the flash A/D converter of the present invention includes a reference voltage generator, a comparing portion, and an address generator. The flash A/D converter further includes an upper digital word generator, a lower digital word generator, and a latch portion. The reference voltage generator includes $2^N$ resistors connected in series between a first supply voltage and a second supply voltage, where 'N' is equal to the number of digital signal bits. The reference voltage generator provides a reference voltage at each connection point between the resistors. The comparing portion includes first through mth comparators, where m is defined as equal to $2^{(N-1)}-1$. The comparing portion compares every other reference voltage output with the corresponding analog input signal. The address generator generates a $2^{(N-1)}$ bit address responsive to the output of each of the comparators. The upper digital word generator generates (N-1) upper bits of a digital word responsive to the address. The lower digital word generator selects one of the remaining reference voltages, excluding every other reference voltage, responsive to the address. The lower digital word generator further compares the selected reference voltage with the analog input signal, and generates the least significant bit of a digital word. The latch portion latches the (N-1) upper bits with the least significant bit of the digital word.

According to the preferred embodiment of the present invention, the address generator includes first logic means for receiving a supply voltage and the output of the first comparator and performing a logical operation. The address generator further includes second through mth logic means $(m=2^{(N-1)}-1)$, each for receiving the outputs of two adjacent comparators and performing a logical operation thereon. The address generator further includes a (m+1)th logic means for receiving the output of the mth comparator and a ground voltage, and performing a logical operation thereon. The upper digital word generator is preferably either a programmable logic array (PLA) or a read-only-memory (ROM). The lower digital word generator includes $2^{(N-1)}$ switches having input terminals connected to the remaining reference voltages excluding the every other reference voltages and output terminals which are commonly connected. The lower digital word generator further includes a comparator for comparing an output signal of each of the commonly connected output terminals with the analog input signal. A control signal of each of the switches is directed to each bit of the address.

BRIEF DESCRIPTION OF THE DRAWINGS

The above object and advantages of the present invention will become more apparent by describing in detail a preferred embodiment of the present invention with reference to the attached drawings in which.

DETAILED DESCRIPTION OF THE INVENTION

Figure 1:
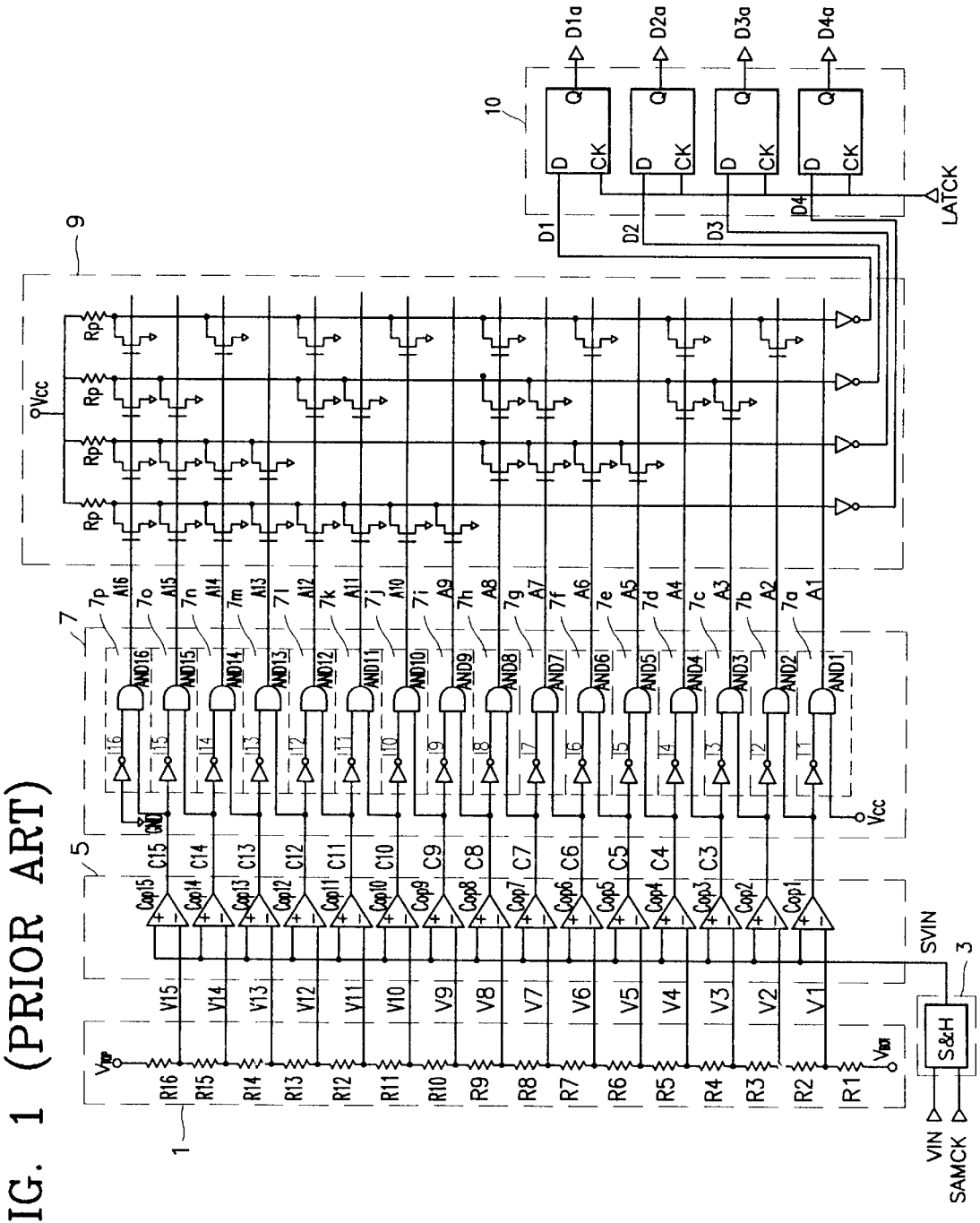
FIG. 1 is a circuit diagram of a conventional flash A/D converter.
Figure 2:
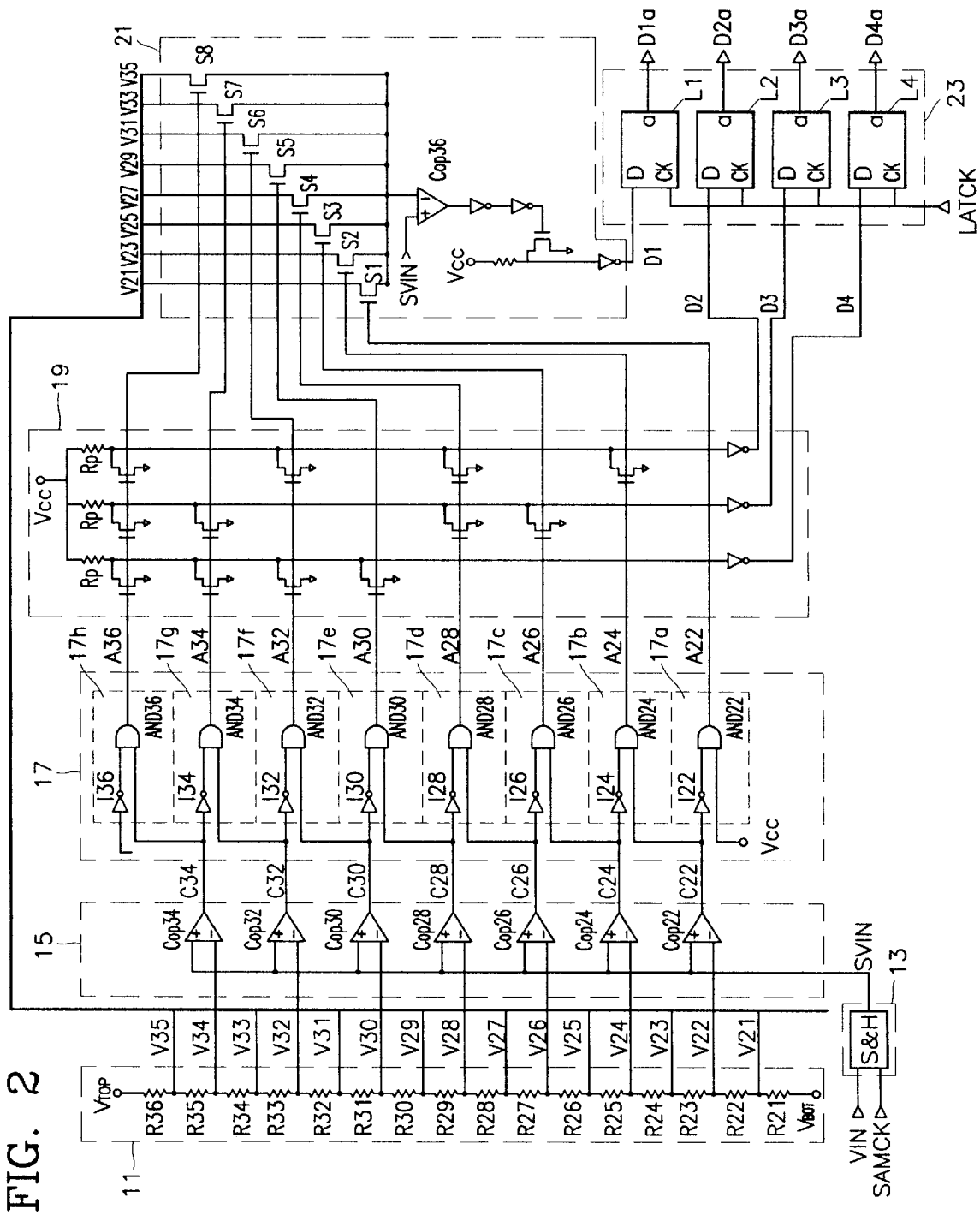
FIG. 2 is a circuit diagram of a flash A/D converter according to the preferred embodiment of the present invention.

Referring to FIG. 2, a flash A/D converter of the present invention includes a reference voltage generator 11, a sample and hold circuit 13, a comparing portion 15, an address generator 17, an upper digital word generator 19, a lower digital word generator 21, and a latching portion 23.

Reference voltage generator 11 has $2^4$ resistors R21–R36 serially connected between first supply voltage $V_{TOP}$ and second supply voltage $V_{BOT}$. Each of resistors R21–R36 are of the same size. Reference voltage generator 11 generates $2^4-1$ reference voltages V21–V35 at each junction of two resistors. Comparing portion 15 includes first through seventh comparators COP22–COP34, each of which compares every other reference voltage output from reference voltage generator 11. That is, comparators COP22–COP24 compare each of reference voltages V22, V24, V26, V28, V30, V32, and V34, in even numerical places, with analog signal SVIN. Address generator 17 generates a $2^3$ bit address A22–A36 responsive to outputs C22–C34 of comparators COP22–COP34. Upper digital word generator 19 generates three upper bits D2, D3, and D4 of a 4-bit digital word responsive to the $2^3$ bit address A22–A36. Lower digital word generator 21 selects each of the remaining reference voltages V21, V23, V25, V27, V29, V31, V33, and V35 in odd numerical places responsive to the $2^3$-bit address A22–A36 and then compares each selected reference voltage with analog signal SVIN. After doing so, lower digital word generator 21 generates the least significant bit (LSB) D1 of the digital word to be output. Latching portion 23 latches the three upper bits D2, D3, and D4 with the LSB, D1.

Analog signal SVIN is the output signal of sample and hold circuit 13. Sample and hold circuit 13 generates analog signal SVIN responsive to an input signal VIN and clock signal SAMCK. Address generator 17 includes first logic means 17a for performing a logic operation on supply voltage Vcc and output signal C22 of first comparator COP22. Address generator 17 further includes second through seventh logic means 17b–17g for performing a logic operation on each of the outputs of two adjacent comparators, for example, output signals C22 and C24 of comparators COP22 and COP24, output signals C24 and C26 of comparators COP24 and COP26, and so on. Address generator 17 further includes eight logic means 17h for performing a logic operation on output signal C34 of seventh comparator COP34 and ground voltage GND. First through eighth logic means 17a–17h each comprises one of the plurality of inverters 122–136 and one of the plurality of AND gates AND22–AND36 such that each logic means generates a logic high output signal only if the logic levels of the two signals received at the input terminals are different from each other. Additionally, upper digital word generator 19 includes either a Programmable Logic Array (PLA) or Read Only Memory (ROM).

Lower digital word generator 21 includes 23 switches S1–S8 each connected to one of reference voltages V21, V23, V25, V27, V29, V31, V33, and V35. Lower digital word generator 21 also includes comparator COP36 for comparing the output signal of the commonly connected terminals of switches S1–S8 with analog signal SVIN. The control signal of each of switches S1–S8 is connected to the gate of switches S1–S8 and corresponds to each bit of address A22–A36. Each switch S1–S8 passes data from its input terminal to its output terminal when the control signal is at a logic high. Preferably, switches S1–S8 are NMOS transistors as shown in FIG. 2. Latching portion 23 includes second through fourth latches L2, L3, and L4 for latching the three upper bits D2, D3, and D4 of the digital word, and a first latch L1 for latching LSB D1 of the digital word.

The A/D converter shown in FIG. 2 operates as follows. When the analog voltage level of analog signal SVIN is between reference voltages V28 and V29, for example, output signals C22–C28 from comparators COP22–COP28 change to a logic high, whereas the outputs C30–C34 from comparators COP30–COP34 change to a logic low. Thus, only output signal A30 of fifth logic means 17e changes to a logic high whereas the outputs A22, A24, A26, A28, A32, A34, and A36 of the remaining logic means 17a, 17b, 17c, 17d, 17f, 17g, and 17h change to a logic low. Therefore, the three upper bits D4, D3, and D2 of the digital word become logic 1, 0, 0. Moreover, since only output A30 of fifth logic means 17e becomes high, only switch S5 of lower digital word generator 21 switches on, passing reference voltage V29 to the input terminal of comparator COP36. Comparator COP36 compares reference voltage V29 with analog signal SVIN and outputs a logic low signal since the voltage level of analog signal SVIN is lower than reference voltage V29. Hence, LSB D1 of the digital word becomes logic 0. In a similar manner, any voltage level of analog signal SVIN is converted into a 4-bit (D4, D3, D2, D1) digital word.

Therefore, the flash A/D converter of the present invention requires a significantly reduced number of comparators and significantly smaller ROMs as compared to conventional flash A/D converters. In the case of a 4-bit conversion, the conventional flash AID converter requires 15 comparators whereas the flash A/D converter of the present invention can be realized with only 8 comparators, an 8×3 ROM, and 8 simple switches. It follows that the flash A/D converter of the present invention significantly reduces power consumption and semiconductor layout size.

The present invention is not limited to the above embodiment. It is clearly understood that many variations are possible by anyone skilled in the art within the scope and spirit of the present invention.

What is claimed is:

1. A flash A/D converter for converting an analog signal into an N-bit digital signal, comprising:
   reference voltage generating means having $2^N$ serially connected resistors coupled to a first and a second supply voltage for generating a reference voltage at each junction of two resistors;
   comparing means having a plurality of comparators for comparing a first group of reference voltages with the analog signal thereby generating a plurality of compare signals;
   means for generating a $2^{(N-1)}$-bit address responsive to the plurality of compare signals;
   upper digital word generating means for generating (N-1) upper bits of the digital word responsive to the address;
   lower digital word generating means for generating the least significant bit of the digital word by selecting a reference voltage from a second group of reference voltages responsive to the address and comparing the selected reference voltage with the analog signal; and
   means for latching the (N-1) upper bits with the least significant bit of the digital word.

2. The flash A/D converter of claim 1 wherein the $2^N$ serially connected resistors are of the same size.

3. The flash A/D converter of claim 1 wherein the analog signal is generated by a sample and hold circuit.

4. The flash A/D converter of claim 1 wherein the means for generating a $2^{(N-1)}$-bit address comprises:
   first logic means for performing a first logic operation on a first supply voltage and a first compare signal of said plurality of compare signals;
   second through $2^{(N-1)}-1$ logic means for performing a second logic operation on the plurality of the compare signals, each logic means of second through $2^{(N-1)}-1$ performing a second logic operation on a pair of compare signals of said plurality of compare signals output from two adjacent comparators; and
   $2^{(N-1)}$ logic means for performing a third logic operation on a second supply voltage and a second compare signal.

5. The flash A/D converter of claim 1 wherein the upper digital word generating means is a PLA or a ROM.

6. The flash A/D converter of claim 1 wherein the lower digital word generating means comprises:
   $2^{(N-1)}$ switches for selecting a reference voltage of a second group of reference voltages responsive to the (N-1) upper bits; and
   a comparator for comparing the selected reference voltage with the analog signal.

7. An A/D converter for converting an analog signal into a digital signal, comprising:
   a reference voltage generator for generating a plurality of reference voltages;
   a comparator circuit coupled to the reference voltage generator for generating a plurality of comparator circuit output signals by comparing a first predetermined group of the plurality of reference voltages with the analog signal;
   a logic circuit coupled to the comparator circuit for generating a multiple bit address responsive to the plurality of comparator circuit output signals;
   an upper word generating circuit coupled to the logic circuit for generating upper bits of the digital signal responsive to the multiple bit address; and a lower word generating circuit coupled to the upper word generating circuit for generating the least significant bit of the digital signal responsive to a second predetermined group of the plurality of reference voltages.

8. The A/D converter of claim 7 wherein the reference voltage generator is connected between a first and a second power supply and includes a plurality of serially connected resistors.

9. The A/D converter of claim 8 wherein each of the plurality of serially connected resistors are of the same size.

10. The A/D converter of claim 7 wherein the comparator circuit includes a plurality of comparators, each comparator generating one of the plurality of comparator output signals by comparing one of the reference voltages of the first predetermined group of reference voltages with the analog signal.

11. The A/D converter of claim 10 wherein the first predetermined group of reference voltages is exclusive of the second predetermined group of reference voltages.

12. The A/D converter of claim 7 wherein the logic circuit includes a first logic subcircuit for comparing one of the plurality of comparator circuit output signals with a first power supply and a second logic subcircuit for comparing another of the plurality of comparator circuit output signals with ground.

13. The A/D converter of claim 7 wherein the upper word generating circuit is a programmable logic array or a read only memory.

14. The A/D converter of claim 7 wherein the lower word generating circuit includes a plurality of switches and a comparator, the plurality of switches for selecting a reference voltage of the second predetermined group of reference voltages responsive to the multiple bit address.

15. The A/D converter of claim 14 wherein the comparator generates the least significant bit of the digital signal by comparing the selected reference voltage of the second predetermined group of reference voltages with the analog signal.

16. The A/D converter of claim 7 further including a latching portion for latching the upper bits of the digital signal with the least significant bit of digital signal.

17. A method for converting an analog signal to a digital signal, the method comprising:

generating a plurality of reference voltages;

generating a plurality of compare signals by comparing a corresponding plurality of reference voltages selected from a first group of the plurality of reference voltages with the analog signal;

generating a multiple bit address signal responsive to the plurality of compare signals;

generating upper bits of a digital signal responsive to the multiple bit address;

selecting a reference voltage from a second group of the plurality of reference voltages; and generating the least significant bit of the digital signal by comparing the selected reference voltage from the second group of the plurality of reference voltages with the analog signal.

18. The method of claim 17 further including latching the upper bits with the least significant bit of the digital signal.

19. The method of claim 17 wherein generating the least significant bit of the digital signal includes gating the selected reference voltage of the second group of the plurality of reference voltages responsive to the multiple bit address.

20. The method of claim 17 wherein generating a multiple bit address includes receiving a supply voltage and the plurality of compare signals, comparing a first of the plurality of compare signals with the supply voltage and comparing a second of the plurality of compare signals with ground.

* * * * *

UNITED STATES PATENT AND TRADEMARK OFFICE
CERTIFICATE OF CORRECTION

PATENT NO. : 5,818,379
DATED : October 6, 1998
INVENTOR(S) : Kim

It is certified that error appears in the above-identified patent and that said Letters Patent is hereby corrected as shown below:

Column 2,
Line 4, "m=$2^{(N-1)}$-1" should read -- m=$2^{(N-1)}$-1 --.
Line 11, "$2^{(N-1)}$)" should read -- $2^{(N-1)}$ --.

Column 3,
Line 13, "122-136" should read -- I22-I36 --.
Line 20, "23" should read -- $2^3$ --.
Line 60, "AID" should read -- A/D --.

Column 4,
Line 30, "$2^{(N-1)}$-bit" should read -- $2^{(N-1)}$-bit --.

Signed and Sealed this

First Day of April, 2003

JAMES E. ROGAN
*Director of the United States Patent and Trademark Office*